United States Patent
Schmidt et al.

(10) Patent No.: US 9,257,607 B2
(45) Date of Patent: Feb. 9, 2016

(54) RED EMITTING LUMINESCENT MATERIALS

(75) Inventors: Peter Josef Schmidt, Aachen (DE); Walter Mayr, Alsdorf (DE); Baby-Seriyati Schreinemacher, Eynatten (DE); Joerg Meyer, Lippstadt (DE); Hans-Helmut Bechtel, Roetgen (DE)

(73) Assignee: Koninklijke Philips N.V., Eindhoven (NL)

( * ) Notice: Subject to any disclaimer, the term of this patent is extended or adjusted under 35 U.S.C. 154(b) by 14 days.

(21) Appl. No.: 13/988,852

(22) PCT Filed: Nov. 28, 2011

(86) PCT No.: PCT/IB2011/055329
§ 371 (c)(1),
(2), (4) Date: May 22, 2013

(87) PCT Pub. No.: WO2012/073177
PCT Pub. Date: Jun. 7, 2012

(65) Prior Publication Data
US 2013/0240943 A1    Sep. 19, 2013

(30) Foreign Application Priority Data
Dec. 1, 2010   (EP) .................................... 10193251

(51) Int. Cl.
*H01L 33/26*    (2010.01)
*C09K 11/08*    (2006.01)
*C09K 11/77*    (2006.01)
*H01L 33/50*    (2010.01)

(52) U.S. Cl.
CPC ............ *H01L 33/26* (2013.01); *C09K 11/0883* (2013.01); *C09K 11/7734* (2013.01); *H01L 33/502* (2013.01)

(58) Field of Classification Search
CPC ....... H01L 33/502; H01L 33/50; H01L 33/26; C09K 11/0883; C09K 11/7734
See application file for complete search history.

(56) References Cited

U.S. PATENT DOCUMENTS

| 6,680,569 B2* | 1/2004 | Mueller-Mach et al. ...... 313/502 |
| 6,717,353 B1* | 4/2004 | Mueller et al. ................ 313/501 |
| 6,924,514 B2* | 8/2005 | Suenaga .......................... 257/98 |
| 6,956,247 B1* | 10/2005 | Stockman ...................... 257/98 |
| 7,598,194 B2 | 10/2009 | Hirosaki et al. |

(Continued)

FOREIGN PATENT DOCUMENTS

| EP | 1669429 A2 | 6/2006 |
| EP | 1734096 A1 | 12/2006 |

(Continued)

OTHER PUBLICATIONS

Rong-Jun Xie et al; "Optical Properties of Eu2+ in A-SiALON", Journal of Physical Chemistry. American Chemical Society, Columbus, OH, US, vol. 108, No. 32, Jan. 1, 2004, pp. 12027-12031, XP002584652.

(Continued)

*Primary Examiner* — Tucker J Wright

(57) ABSTRACT

The invention relates to a novel red emitting material of $(Ba_{1-x-y-z}Sr_xCa_yEu_z)_2Si_{5-a-b}Al_aN_{8-a-4b}O_{a+4b}$ having an average particle size distribution $d_{50}$ of >6 μm, with $0.3 \leq x \leq 0.9$, $0.01 \leq y \leq 0.1$, $0.005 \leq z \leq 0.04$, $0 \leq a \leq 0.2$ and $0 \leq b \leq 0.2$.

4 Claims, 3 Drawing Sheets

(56) References Cited

U.S. PATENT DOCUMENTS

| | | | |
|---|---|---|---|
| 7,671,529 B2 | 3/2010 | Mueller et al. | |
| 2003/0094893 A1* | 5/2003 | Ellens et al. | 313/503 |
| 2005/0156496 A1* | 7/2005 | Takashima et al. | 313/237 |
| 2006/0061263 A1* | 3/2006 | Sakuma et al. | 313/503 |
| 2006/0124947 A1* | 6/2006 | Mueller et al. | 257/98 |
| 2006/0255710 A1* | 11/2006 | Mueller-Mach et al. | 313/485 |
| 2006/0291246 A1* | 12/2006 | Hattori et al. | 362/614 |
| 2007/0034834 A1* | 2/2007 | Liu et al. | 252/301.4 F |
| 2007/0259206 A1* | 11/2007 | Oshio | 428/690 |
| 2008/0001126 A1* | 1/2008 | Hirosaki | 252/519.51 |
| 2008/0093979 A1* | 4/2008 | Bechtel et al. | 313/503 |
| 2008/0143246 A1* | 6/2008 | Hirosaki et al. | 313/503 |
| 2009/0026915 A1* | 1/2009 | Nagatomi et al. | 313/503 |
| 2010/0001303 A1 | 1/2010 | Schmidt et al. | |
| 2010/0176713 A1* | 7/2010 | Hanamoto et al. | 313/501 |
| 2010/0187974 A1 | 7/2010 | Zhang et al. | |
| 2010/0289044 A1* | 11/2010 | Krames et al. | 257/98 |
| 2011/0176084 A1* | 7/2011 | Akiho et al. | 349/61 |

FOREIGN PATENT DOCUMENTS

| | | |
|---|---|---|
| EP | 2022835 A1 | 2/2009 |
| WO | 0140403 A1 | 6/2001 |
| WO | 2005052087 A1 | 6/2005 |

OTHER PUBLICATIONS

Hui-Li Li et al; "Synthesis and Luminescence Properties of Orange-Red-Emitting $M_2Si_5N_8$: $Eu^{2+}$ (M=Ca, Sr, Ba) Light-Emitting Diode Conversion Phosphors by a Simple Nitridation of $MSi_2$", International Journal of Applied Ceramic Technology, vol. 6, No, 4, Jul. 1, 2009, pp. 459-464, XP55016784.

* cited by examiner

RED EMITTING LUMINESCENT MATERIALS

FIELD OF THE INVENTION

The present invention is directed to novel luminescent materials for light emitting devices, especially to the field of novel luminescent materials for LEDs.

BACKGROUND OF THE INVENTION

Phosphors comprising silicates, phosphates (for example, apatite) and aluminates as host materials, with transition metals or rare earth metals added as activating materials to the host materials, are widely known. As blue LEDs, in particular, have become practical in recent years, the development of white light sources utilizing such blue LEDs in combination with such phosphor materials is being energetically pursued.

Especially red emitting luminescent materials have been in the focus of interest and several materials have been proposed, e.g. U.S. Pat. No. 6,680,569(B2), " Red Deficiency Compensating Phosphor for a Light Emitting Device", or from WO patent application 2005/052087 A1.

However, there is still the continuing need for orange to red emitting luminescent materials which are usable within a wide range of applications and especially allow the fabrication of phosphor warm white pcLEDs with optimized luminous efficiency and color rendering.

SUMMARY OF THE INVENTION

It is an object of the present invention to provide a material which is usable within a wide range of applications and especially allows the fabrication of phosphor warm white pcLEDs with optimized luminous efficiency and color rendering.

This object is solved by a material according to claim 1 of the present invention. Accordingly, a material $(Ba_{1-x-y-z}Sr_xCa_yEu_z)_2Si_{5-a-b}Al_aN_{8-a-4b}O_{a+4b}$ having an average particle size distribution $d_{50}$ of ≥6 μm is provided, whereby $0.3 \leq x \leq 0.9, 0.01 \leq y \leq 0.1, 0.005 \leq z \leq 0.04, 0 \leq a \leq 0.2$ and $0 \leq b \leq 0.2$.

It should be noted that by the term "$(Ba_{1-x-y-z}Sr_xCa_yEu_z)_2Si_{5-a-b}Al_aN_{8-a-4b}O_{a+4b}$"—especially and/or additionally any material is meant and/or included, which has essentially this composition. This goes in analogy for all other materials mentioned in this invention.

The term "essentially" means especially that ≥95%, preferably ≥97% and most preferred ≥99% wt-%. However, in some applications, trace amounts of additives may also be present in the bulk compositions. These additives particularly include such species known to the art as fluxes. Suitable fluxes include alkaline earth—or alkaline—metal oxides, borates, phosphates and halides such as fluorides, ammonium chloride, $SiO_2$ and the like and mixtures thereof.

Such a material has shown for a wide range of applications within the present invention to have at least one of the following advantages
- Using the material as luminescent material, LEDs may be built which show improved lighting features, especially thermal stability.
- The photostability of the material is greatly enhanced in contrast with materials having a smaller particle size
- The material has a higher emission than comparable materials.

A similar material is known e.g. from the U.S. Pat. No. 7,671,529. However, surprisingly it has been found that by using the material composition as described in this invention, a material with a larger average particle size and—depending on the actual application—furthermore advantageous material features can be achieved.

Without being bound to any theory the inventors believe that it is especially the content of calcium as described which leads to bigger particles (and which will be explained later on in greater detail).

Therefore this invention also relates to the use of calcium in siliconitridic materials for increasing the average particle size.

According to a preferred embodiment of the present invention, $0.02 \leq y \leq 0.04$. It has been shown that a calcium content in this amount is already sufficient to result in greater particle size, on the other hand larger amounts of Ca may possibly lead to unwanted broadening of the emission band and a thus lowered luminous efficiency of the phosphor material.

According to a preferred embodiment of the present invention, $0.35 \leq x \leq 0.8$, i.e. the Barium content is somewhat around 20% to 60% mol percent. This has been found to be advantageous for many applications due to the improved luminescence properties of the resulting material.

According to a preferred embodiment of the present invention, $0 < b \leq 0.2$, i.e. the material comprises oxygen. Surprisingly this has been found to greatly increase the photostability of the material for many applications within the present invention. Without being bound to any theory, it is believed that small amounts of $SiN_4$ tetrahedra containing Si bridging N atoms are removed from the $M_2Si_5N_8$ lattice and the resulting charge is compensated by terminal O atoms. However, in most applications it has been found that the oxygen content should not be too high, i.e. b should not exceed 0.2.

According to a preferred embodiment of the present invention, less than 10% of the phosphor particles show an average diameter ≤2 μm. This has been found advantageous since by doing so for most applications the photostability may be enhanced.

According to a preferred embodiment of the present invention, for ≥90% of the phosphor particles the ratio of the longest and shortest particle edge length is ≤5. This has been found advantageous since by doing so for most applications the industrial applicability can be easened.

As described above, the present invention relates to the use of calcium in siliconitridic materials for increasing the average particle size. This goes especially for materials of the type $M_2Si_{5-a-b}Al_aN_{8-a-4b}O_{a+4b}$ (with $0 \leq a \leq 2$ and $0 < b \leq 2$), which are insofar preferred embodiments of the present invention.

It should be noted that the inventive use of calcium differs from the known use of flux materials, some of which are known to also enhance particle size. According to the invention, calcium is essentially evenly distributed in the powder whereas flux materials are usually not part of the luminescnet material except for impurities.

According to a preferred embodiment of the present invention, the material has the structure $M_2Si_{5-a-b}Al_aN_{8-a-4b}O_{a+4b}$, with M being a divalent metal ion and with $0 \leq a \leq 2$ and $0 \leq b \leq 2$.

According to a further preferred embodiment of the present invention, the material has the structure according to the present invention.

The present invention furthermore relates to a light emitting structure, especially a LED, comprising at least one material according to the present invention.

The present invention furthermore relates to as system comprising a material according to the present invention and/ or materials made according to the inventive methods shown above, being used in one or more of the following applications:
- Office lighting systems
- household application systems
- shop lighting systems,
- home lighting systems,
- accent lighting systems,
- spot lighting systems,
- theater lighting systems,
- fiber-optics application systems,
- projection systems,
- self-lit display systems,
- pixelated display systems,
- segmented display systems,
- warning sign systems,
- medical lighting application systems,
- indicator sign systems, and
- decorative lighting systems
- portable systems
- automotive applications
- green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

BRIEF DESCRIPTION OF THE DRAWINGS

Additional details, features, characteristics and advantages of the object of the invention are disclosed in the subclaims, the figures and the following description of the respective figures and examples, which—in an exemplary fashion— show several embodiments and examples an inventive material according to the invention.

EXPERIMENTAL SECTION

The following invention will—together with the figures—furthermore be understood by the following examples which are merely for illustration purposes and which are non-binding.

General Preparation Method

All materials—whether inventive or comparative—were made according to the following prescription (and analogous deviations thereof):

Phosphors of compositions $(Ba_{0.485-0.5x}Sr_{0.485-0.5x}Ca_xEu_{0.03})_2Si_{4.99}O_{0.04}N_{7.96}$ with varying x=0, 0.01 and 0.02 have been prepared by mixing of $BaH_2$ (made by hydration of Ba rods, >99% purity), $SrH_2$ (made by hydration of Sr granules, >99% purity), $CaH_2$ (Aldrich), $Eu_2Si_5N_8$ (made by reaction of $Eu_2O_3$ with carbon and silicon nitride at 1400° C.), $Si_3N_4$ (UBE SN E-10) with a molar ratio Ba+Sr+Ca+Eu/Si=0.417 and firing twice with intermediate ball milling at 1620° C. in a molybdenum crucible under $H_2/N_2$ atmosphere. After ball milling, screening and washing of the powders with 2N HCl, water and isopropanol and final drying, powder phosphors have been obtained.

A significant effect of Ca addition on grain growth can be observed by the change of particle size distribution (average particle diameter for a given volume fraction, measured by Laser scattering with a Beckman Coulter LS 200 series laser diffraction particle analyzer), as can be seen from Table I:

TABLE I

| Sample composition | Inventive/ Comparative | <10 vol % | <50 vol % | <90 vol % |
|---|---|---|---|---|
| $(Ba_{0.485}Sr_{0.485}Eu_{0.03})_2Si_{4.99}O_{0.04}N_{7.96}$ | Comparative I | 2.18 μm | 4.03 μm | 6.04 μm |
| $(Ba_{0.48}Sr_{0.48}Ca_{0.01}Eu_{0.03})_2Si_{4.99}O_{0.04}N_{7.96}$ | Inventive Example I | 2.64 μm | 6.15 μm | 13.37 μm |
| $(Ba_{0.475}Sr_{0.475}Ca_{0.02}Eu_{0.03})_2Si_{4.99}O_{0.04}N_{7.96}$ | Inventive Example II | 5.04 μm | 10.27 μm | 16.55 μm |

Figure 1:
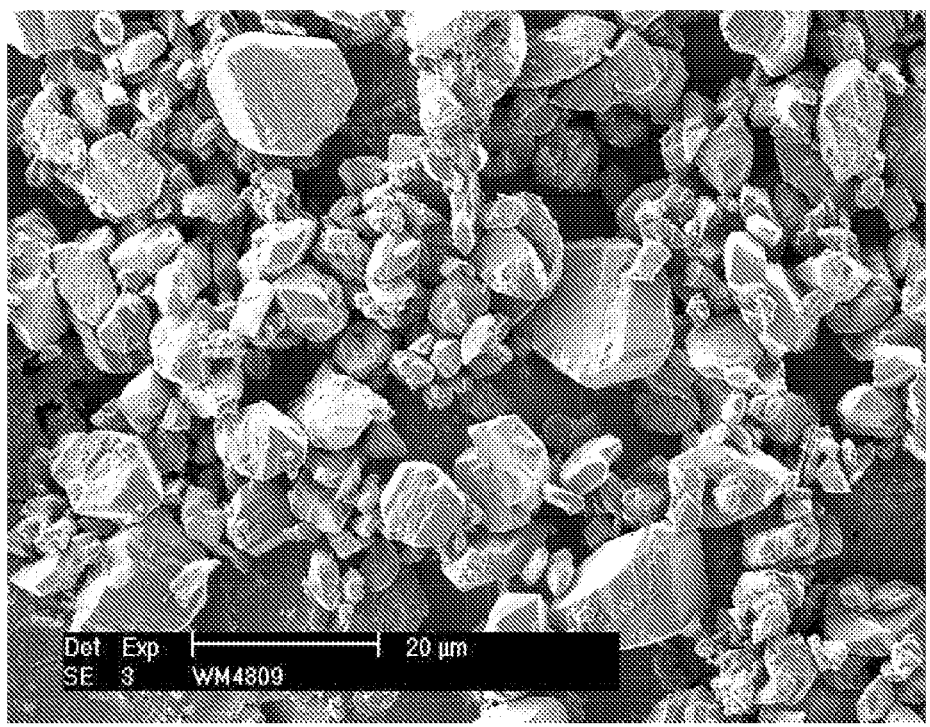
FIG. 1 shows a scanning electron image of a material according to Example I of the present invention
Figure 2:
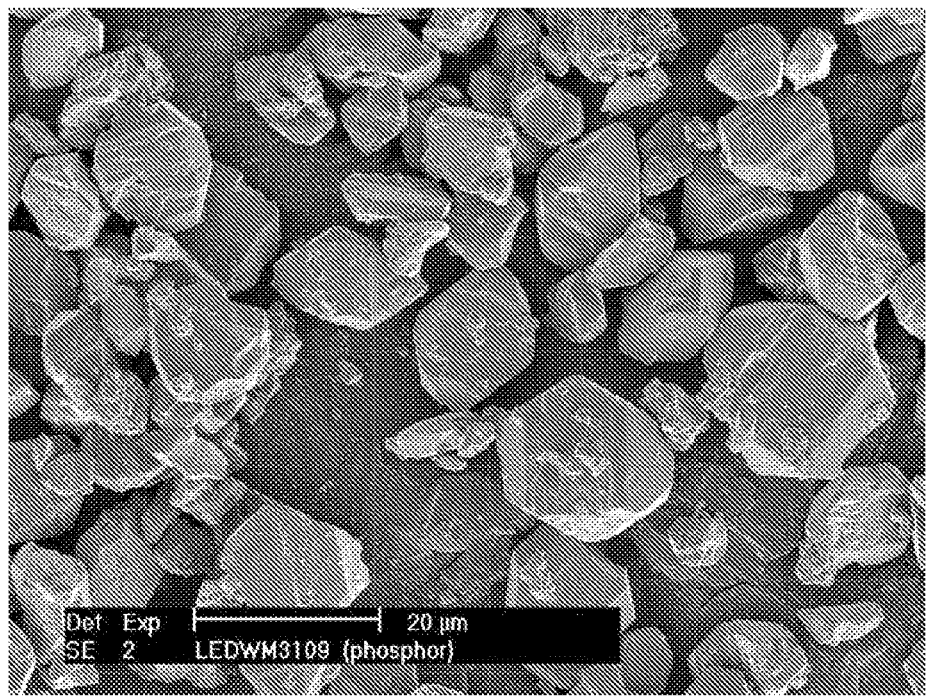
FIG. 2 shows a scanning electron image of a material according to Example II of the present invention
Figure 3:
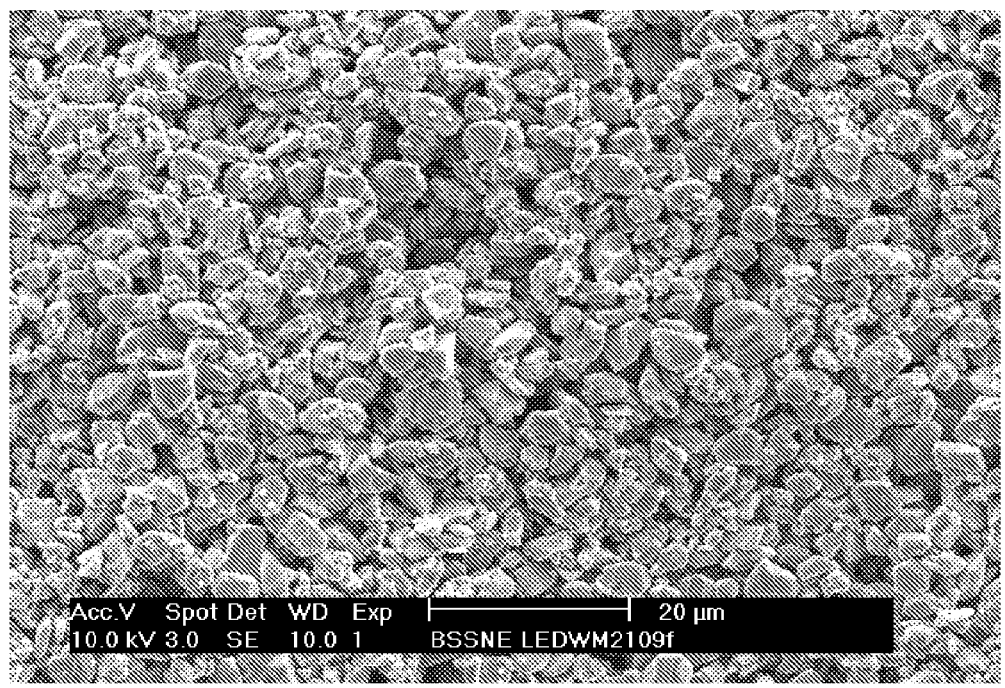
FIG. 3 shows a scanning electron image of a material according to a comparative Example

FIGS. 1 to 3 show scanned electron images of the powders of Inventive Example I, inventive Example II and the comparative Example (no calcium), respectively.

To further illustrate the advantageous feature of the intensive material, the photostability of Inventive Example III (see below) and the Comparative example were investigated.

It was found that the emission intensity decrease after 1 h irradiation with 10 W/cm² blue light and 260° C. phosphor temperature is only 6% for an Inventive Example III while a Comparative Example II (no calcium) shows a decrease of 31%, as can be seen from Table II:

TABLE II

| Sample composition | Inventive/ Comparative | relative emission intensity after 1 h, 10 W/cm² blue flux, $T_{phosphor}$ = 260° C. |
|---|---|---|
| $(Ba_{0.48}Sr_{0.48}Ca_{0.02}Eu_{0.02})_2Si_{4.9}O_{0.04}N_{7.96}$ | Inventive Example III | 94% |
| $(Ba_{0.49}Sr_{0.49}Eu_{0.02})_2Si_{4.9}Al_{0.1}O_{0.1}N_{7.9}$ | Comparative II | 69% |

Figure 4:
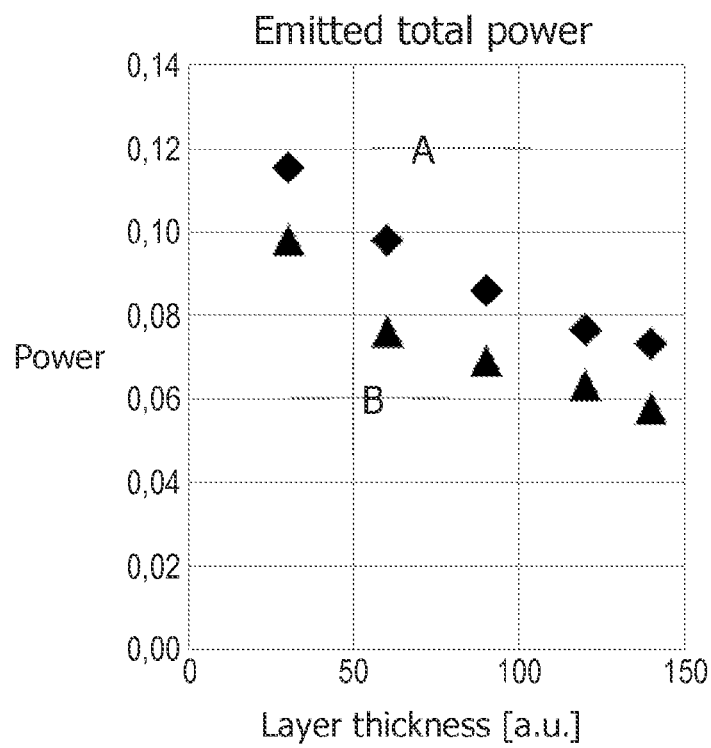
FIG. 4 shows a diagramm of emission power vs. layer thickness for for two pcLED comprising an inventive and a comparative material, respectively.

Further more the optical properties of pcLEDs comprising the material according to Inventive Example III and Comparative Example II were investigated. FIG. 4 shows the total emitted power of the pcLEDs (red phosphor layers on a blue LED, 444 nm peak emission) vs. the layer thickness both for the material of Inventive Example III (diamonds) and Comparative Example II (triangles). For both series, the power decreases with layer thickness, however, the pcLEDs with the material according to the invention always have a higher output power.

Figure 5:
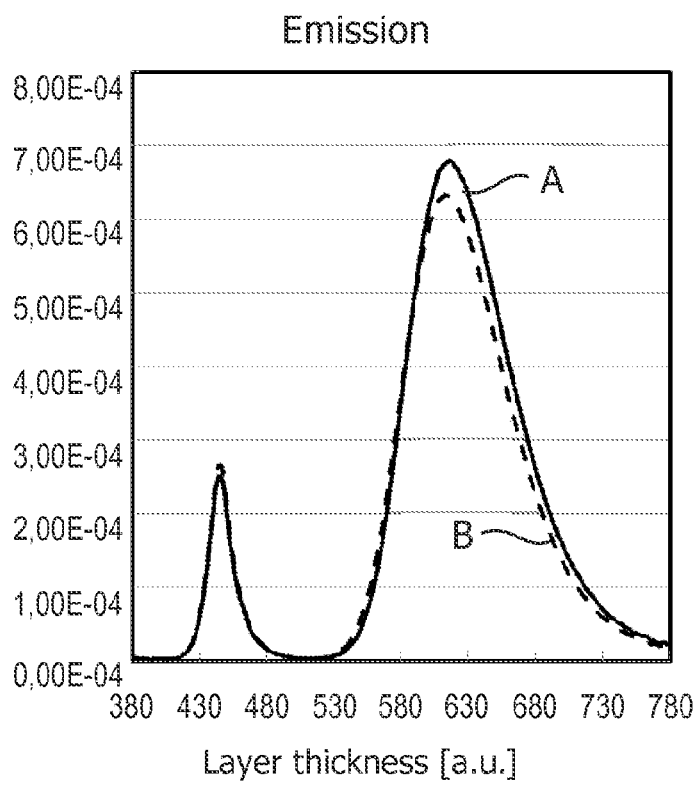
FIG. 5 shows a diagramm of emission vs. wavelength for two pcLEDs comprising the inventive and comparative material of FIG. 4, respectively.

FIG. 5 shows two emission spectra of red phosphor layers on a blue LED (444 nm peak emission) of layers out of the material according to Inventive Example III ("A", solid line) as well as the comparative Example II ("B", dashed line) having identical blue transmission. The pcLED using the material according to the invention delivers approx. 6% percent additional light.

Figure 6:
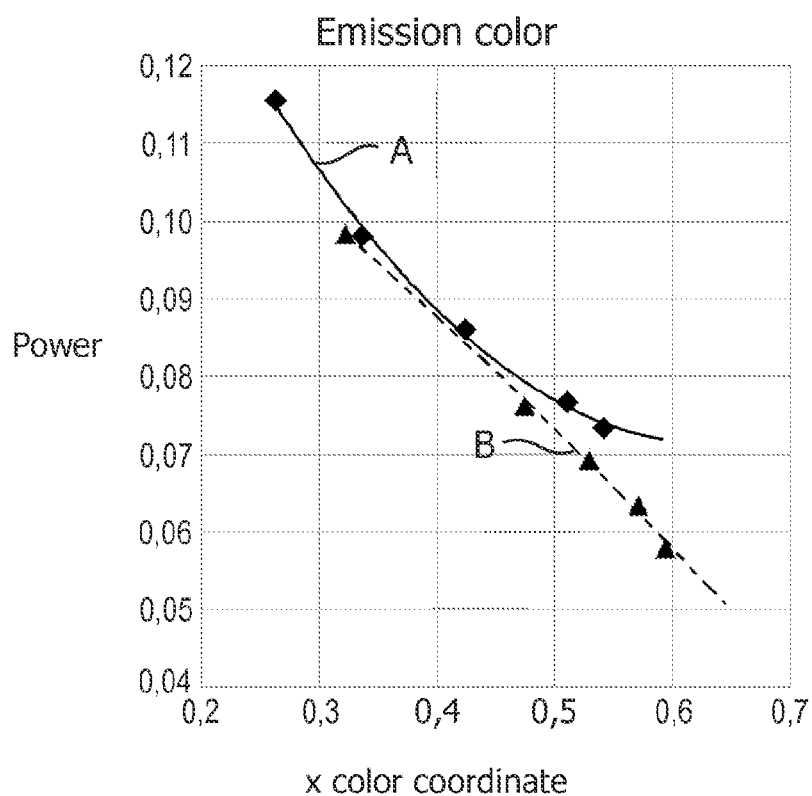
FIG. 6 shows a plot of the total emitted power as a function of the CIE x color coordinate for the two pcLEDs of FIG. 5

FIG. 6 shows a plot of the total emitted power as a function of the CIE x color coordinate for the two pcLEDs of FIG. 5 ("A" and "B" have the same meaning as in FIG. 5). The CIE-color coordinate serves as a measure of the ratio of red to blue light in the LED emission spectrum. From the figure it can clearly be seen that the efficiency advantage of the inventive material increases with increasing conversion of light.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

Methods

The average diameter can be measured by the following procedure based on light scattering (see XU, R. Particle Characterization: Light Scattering Methods, Kluwer Academic Publishers, Dordrecht (2000)). The powder to be measured is suspended in a liquid media such as demineralized water with a dispersant added to stabilize the suspension. The particle suspension is then analyzed by laser diffraction to obtain information about particle size distribution through measurements of scattering intensity as a function of the scattering angle and the wavelength and polarization of light based on applicable scattering models. Such a method is absolute in nature without the need to calibrate instrument. Alternatively, particle sizes can be directly measured with a microscope (optical microscope, scanning electron microscope) and particle size distributions can be calculated based on image processing procedures.

The invention claimed is:

1. A light emitting diode structure comprising a material according to the formula:

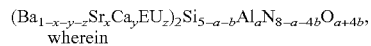
wherein $0.3 \leq x \leq 0.9$,
$0.01 \leq y \leq 0.1$,
$0.005 \leq z \leq 0.04$,
$0 \leq a \leq 0.2$ and
$0 < b \leq 0.2$.

2. The light emitting diode structure according to claim 1, having an average particle size distribution of $\geq 6$ μm.

3. The light emitting diode structure according to claim 1, wherein $0.02 \leq y \leq 0.04$.

4. The light emitting diode structure according to claim 1, wherein $0.35 \leq x \leq 0.8$.

* * * * *